United States Patent
Wang et al.

(10) Patent No.: US 6,740,568 B2
(45) Date of Patent: May 25, 2004

(54) METHOD TO ENHANCE EPITAXIAL REGROWTH IN AMORPHOUS SILICON CONTACTS

(75) Inventors: Yun Yu Wang, Poughquag, NY (US); Johnathan Faltermeier, LaGrange, NY (US); Colleen M. Snavely, Hopewell Junction, NY (US); Michael Maldei, Durham, NC (US); Michael M. Iwatake, Wappingers Falls, NY (US); David M. Dobuzinsky, New Windsor, NY (US); Ravikumar Ramachandran, Pleasantville, NY (US); Viraj Y. Sardesai, Poughkeepsie, NY (US); Philip L. Flaitz, Newburgh, NY (US); Lisa Y. Ninomiya, Danbury, CT (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/206,875

(22) Filed: Jul. 29, 2002

(65) Prior Publication Data

US 2004/0018680 A1 Jan. 29, 2004

(51) Int. Cl.[7] .................... H01L 21/36; H01L 21/336; H01L 21/8242
(52) U.S. Cl. .................... 438/486; 438/300; 438/413; 438/481; 438/482; 438/607; 438/250; 438/253; 438/393; 438/396
(58) Field of Search ............ 438/300, 250–256, 438/393, 399, 413, 481–482, 486, 607

(56) References Cited

U.S. PATENT DOCUMENTS

| | | | | |
|---|---|---|---|---|
| 5,213,989 A | * | 5/1993 | Fitch et al. | 438/365 |
| 5,250,454 A | | 10/1993 | Maszara | 437/41 |
| 5,824,586 A | | 10/1998 | Wollesen et al. | 438/300 |
| 5,980,265 A | | 11/1999 | Tischler | 437/185 |
| 6,107,197 A | * | 8/2000 | Suzuki | 438/677 |
| 6,174,754 B1 | * | 1/2001 | Lee et al. | 438/142 |
| 6,316,320 B1 | * | 11/2001 | Nakahata et al. | 438/300 |
| 6,329,088 B1 | | 12/2001 | Landini | 428/698 |
| 6,395,621 B1 | * | 5/2002 | Mizushima et al. | 438/486 |
| 6,399,993 B1 | * | 6/2002 | Ohnishi et al. | 257/370 |
| 2002/0168868 A1 | * | 11/2002 | Todd | 438/767 |
| 2003/0068885 A1 | * | 4/2003 | Cheong | 438/674 |

OTHER PUBLICATIONS

R. Basir, et al, in "A Simple Process to Produce a High Quality Silicon Surface Prior To Selective Epitaxial growth", IEEE Electron Device Letters vol. 16, No. 7, Jul. 1995.

* cited by examiner

*Primary Examiner*—John F. Niebling
*Assistant Examiner*—Jennifer M. Kennedy
(74) *Attorney, Agent, or Firm*—Slater & Matsil, L.L.P.

(57) ABSTRACT

In a method of forming a contact, a liner reactive ion etch is affected on a substrate to remove silicon nitride and silicon oxide. An oxygen plasma ex-situ clean, a Huang AB clean, and a dilute hydrofluric acid (DHF) clean are affected. Amorphous silicon is deposited and an anneal is performed to regrow and recrystallize amorphous silicon.

8 Claims, 3 Drawing Sheets

METHOD TO ENHANCE EPITAXIAL REGROWTH IN AMORPHOUS SILICON CONTACTS

BACKGROUND OF THE INVENTION

1. Field of the Invention

The invention relates to a process that allows in-situ, lower cost processing of fabrication of complementary bipolar (CB)liner RIE and CB oxide RIE using the same high plasma power tool, while simultaneously allowing epitaxial (epi)-regrowth of amorphous Si in DRAM production.

2. The Prior Art

In dynamic random access memory (DRAM) development, doped poly-Si is used as the complementary bipolar (CB) contact as well as the source of doping in the contact region.

A method of manufacturing a MOSFET is disclosed in U.S. Pat. No. 5,824,586. The method comprises:

forming a source region and a drain region in a substrate;
forming a gate oxide region on a surface of the substrate;
forming a gate on the gate oxide region;
forming gate oxide spacers adjacent to the gate and contiguous with the gate oxide region;
depositing undoped amorphous silicon;
ion implanting wherein the source and drain junctions are formed;
a first rapid thermal anneal wherein limited solid phase epitaxial silicon growth takes place in regions of the amorphous silicon with underlying silicon; and
etching the remaining amorphous silicon.

A method for forming thickened source/drain contact regions for FETs is disclosed in U.S. Pat. No. 5,250,454. The method entails:

depositing a layer of amorphous silicon covering the source and drain contact regions, the gate and the side wall spacer;
heating the layer of amorphous silicon to a temperature sufficient to induce epitaxial regrowth of the amorphous silicon layer in the source and drain regions to form thickened source and drain contact regions; and
wet-etching the substrate to remove the uncrystallized portion of the amorphous silicon in the regions where epitaxial regrowth was not induced and to remove at least a portion of the side wall spacer leaving a groove circumscribing the gate.

U.S. Pat. No. 5,980,265 discloses stable, high temperature electrical contacts to silicon carbide formed using a unique silicide formation process that employs a sacrificial silicon layer between the silicon carbide and a contacting metal, which forms a metal silicide interlayer providing the resulting contact with low specific contact resistance and high electrical and structural stability. The contact interface is formed by reaction below the semiconductor surface, thereby making the in-situ silicide formation process insensitive to surface impurities and oxides and permitting the controlled formation of silicides without the formation of excess carbon and carbides at the contact interface. The silicon layer may optionally be doped in situ during growth or implanted with dopants after growth, to lower the contact resistance and enhance its operational stability.

A method of forming a device quality silicon carbide epitaxial film is disclosed in U.S. Pat. No. 6,329,088 B1. The method comprises: depositing the film at sub-atmospheric pressure conditions on a silicon carbide substrate of hexagonal crystal form, off cut towards the <1100> crystalline direction of the substrate, wherein the silicon carbide epitaxial film has a smooth surface morphology, within an edge exclusion area, and has a root mean square roughness not exceeding about 2 nanometers in a 20×20 $\mu m^2$ area.

U.S. Pat. No. 6,107,197 discloses a method of removing a carbon-contaminated layer from a silicon substrate surface for subsequent selective silicon epitaxial growth thereon. The method comprises:

exposing a carbon-contaminated layer on the silicon substrate surface to a chlorine radical to cause a reaction of the chlorine radical with carbon atoms of the carbon-contaminated layer for removal of the carbon-contaminated layer from the silicon substrate surface, wherein the chlorine radical has been generated by passing a chlorine gas through a heated filament.

R. Basir, et al, in "A Simple Process to Produce a High Quality Silicon Surface Prior To Selective Epitaxial growth", IEEE Electron Device Letters Vol. 16, No. 7, July 1995, disclose a process for eliminating etch damage resulting from oxide etching using RIE on a seed-hole prior to selective epitaxial growth of silicon.

There is a need to provide an in-situ low cost processing means to allow a CB liner RIE and a CB oxide RIE to be conducted in the same high plasma power system while at the same time enabling epi-regrowth of amorphous Si by disrupting the Si—C bonding.

SUMMARY OF THE INVENTION

One object of the present invention is to provide an in-situ lower cost processing means to allow a CB liner RIE and a CB oxide RIE to be conducted in the same high plasma power system.

Another object of the present invention is to provide an in-situ lower cost processing means to allow a CB liner RIE and CB oxide RIE to be conducted in the same high plasma power system, and at the same time enable epi-regrowth of amorphous Si.

A further object of the present invention is to provide an in-situ lower cost processing means to allow a CB liner RIE and a CB oxide RIE to be conducted in the same high plasma power system, and at the same time enable epi-regrowth of amorphous Si by disrupting the Si—C bonding.

In general, the invention is accomplished by:

a) affecting a CB reactive ion etch on a substrate to remove SiN and SiO;
b) affecting an O plasma ex-situ clean;
c) affecting a Huang AB clean;
d) affecting a dilute hydrofluoric acid (DHF) clean;
e) depositing amorphous Si; and
f) annealing to recrystallize and regrow amorphous CB Alternatively, the invention method may be accomplished by:

a) affecting a CB reactive ion etch on a substrate to remove SiN and SiO followed by introducing an O plasma in-situ clean;
b) affecting a Huang AB clean;
c) affecting a dilute hydrofluoric acid (DHF) clean;
d) depositing amorphous Si; and
e) annealing to recrystallize and regrow amorphous CB.

BRIEF DESCRIPTION OF THE DRAWING FIGURES

DETAILED DESCRIPTION OF PREFERRED EMBODIMENT OF THE INVENTION

It has been discovered that if the CB liner formed by reactive ion etching (RIE) is performed at plasma powers equal to or greater than about 500 W, an amorphous layer of about 0.8 Å forms between the crystalline Si and the amorphous Si and there is no CB epi-regrowth. This leads to a high CB contact resistance of from about 5–10 kilo-ohm.

This problem is traced to the RIE damage of the Si surface as a result of the formation of Si—C termination. Normally, if there is less 2 nm $SiO_2$ on top of the Si surface, the amorphous Si can still form epi-regrowth, because at high temperatures, $SiO_2$ tends to form small precipitates, thereby allowing amorphous Si to crystallize on top of the Si single crystal. The Si—C does not form a precipitate and at the same time cannot be cleaned by normal organic cleaning solvents, since the Si—C is not an organic material.

Accordingly, even with a 0.8 Å thick amorphous layer, CB epi-regrowth of amorphous Si on top of the contaminated Si surface is prevented.

At the Si surface, there is a Si—O bond termination, as depicted herewith:

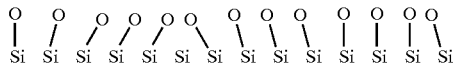

However, after the RIE, which is a process conducted in a reduced environment, the silicon surface becomes terminated with C which has a Si—C bonding as follows:

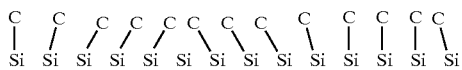

Figure 2:
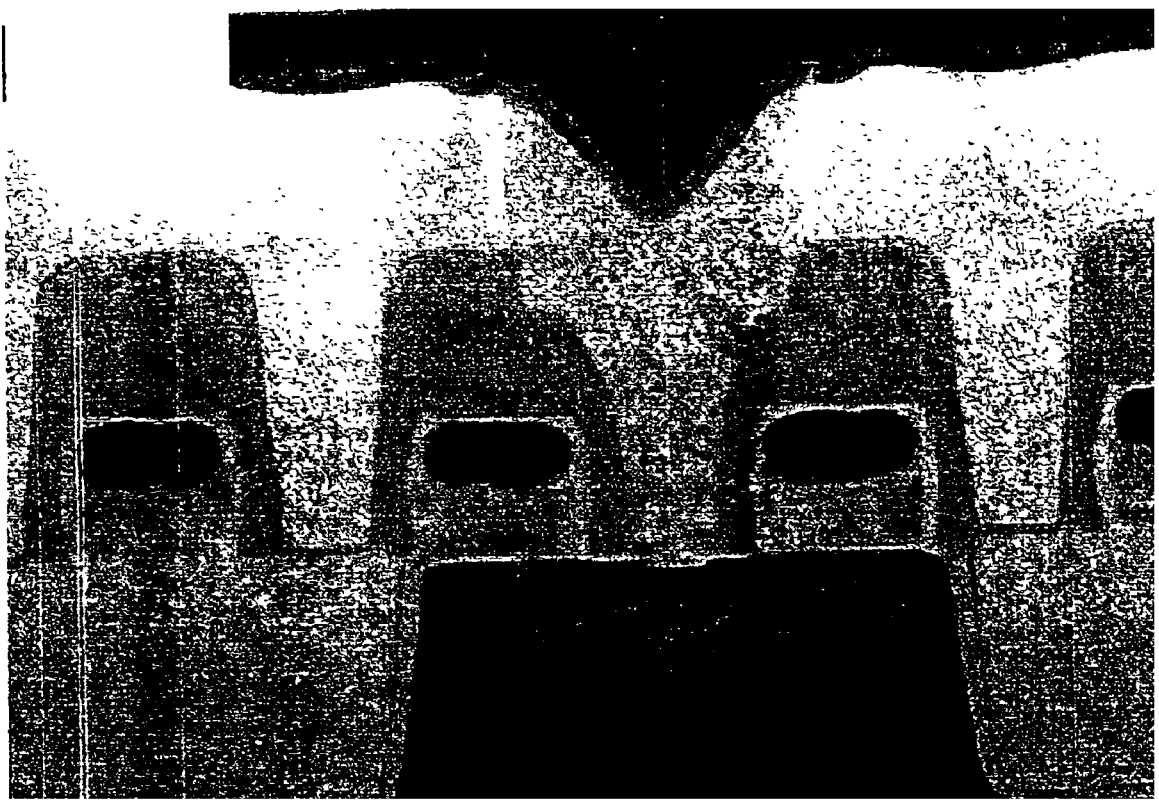
FIG. 2 is a transmission electron microscopic (TEM) picture of a CB contact wherein the Si—C bonding prevents Si epi-regrowth in the CB contact.

This Si—C bonding is not easily broken by normal wet cleaning, and it is this bonding that prevents Si epi-regrowth in the CB contact, as depicted in FIG. 2.

To solve the Si—C bonding problem that prevents epi-regrowth of amorphous CB contacts, O plasma cleaning is used to break the bond of the Si—C.

Since oxide RIE systems are conducted at relatively high plasma power, in order to conduct an in-situ liner RIE, the liner process must be run in a high plasma power system. The present invention allows an in-situ lower cost processing scheme that permits the CB liner RIE and CB oxide RIE to be run in the same high plasma power system that is equal to or greater than about 500 W.

In one embodiment of the invention process, the method to enhance epi-growth in amorphous poly CB contacts is accomplished by:

a) affecting a CB reactive ion etch on a substrate to remove SiN and SiO;
 b) affecting an O plasma ex-situ clean;
 c) affecting a Huang AB clean;
 d) affecting a dilute hydrofluoric acid (DHF) clean;
 e) depositing amorphous Si; and
 f) annealing to recrystallize and regrow amorphous CB.

In a second embodiment of the invention process, the method to enhance epi-regrowth in amorphous poly CB contacts is accomplished by:

a) affecting a CB reactive ion etch on a substrate to remove SiN and SiO followed by introducing an O plasma in-situ clean;
 b) affecting a Huang AB clean;
 c) affecting a dilute hydrofluoric acid (DHF) clean;
 d) depositing amorphous Si; and
 e) annealing to recrystallize and regrow amorphous CB.

In connection with the invention process, it should be noted that the Huang AB clean is a sequential one wherein cleaning is first affected by using 5 parts of water to 1 part hydrogen peroxide or 1 part ammonium hydroxide following by cleaning with 5 parts of water to 1 part of nitric acid.

The invention methods to enhance epi-regrowth in amorphous poly CB contacts, permits in-situ, lower cost processing to allow CB liner RIE and CB oxide RIE to be conducted in the same high plasma power tool, while at the same time, allowing epi-regrowth of amorphous Si.

Amorphous poly-Si can be recrystallized very easily on top of Si with a thin O terminated Si surface. However, due to the oxide and nitride reactive ion etch process (RIE), the Si surface is terminated by a C atom, which forms Si—C bonding. Normal process cleaning such as DHF or Huang AB does not work on the Si—C bonding surface. The only way to clean the surface is to introduce O-plasma to break the bond between Si and C, and to form CO or $CO_2$. This cleaning process is implemented at the very end of the RIE process with the introduction of O plasma to remove monolayer C at the surface of Si. In addition to this, slight oxidation of Si surface through O-plasma results in a O terminated Si surface, which can be easily cleaned by the DHF wet cleaning process.

This phenomenon is apparent in FIG. 2, which shows the RIE process etched into Si. Without O-plasma at the very end to remove C, epitaxial growth of amorphous Si does not occur.

Figure 1:
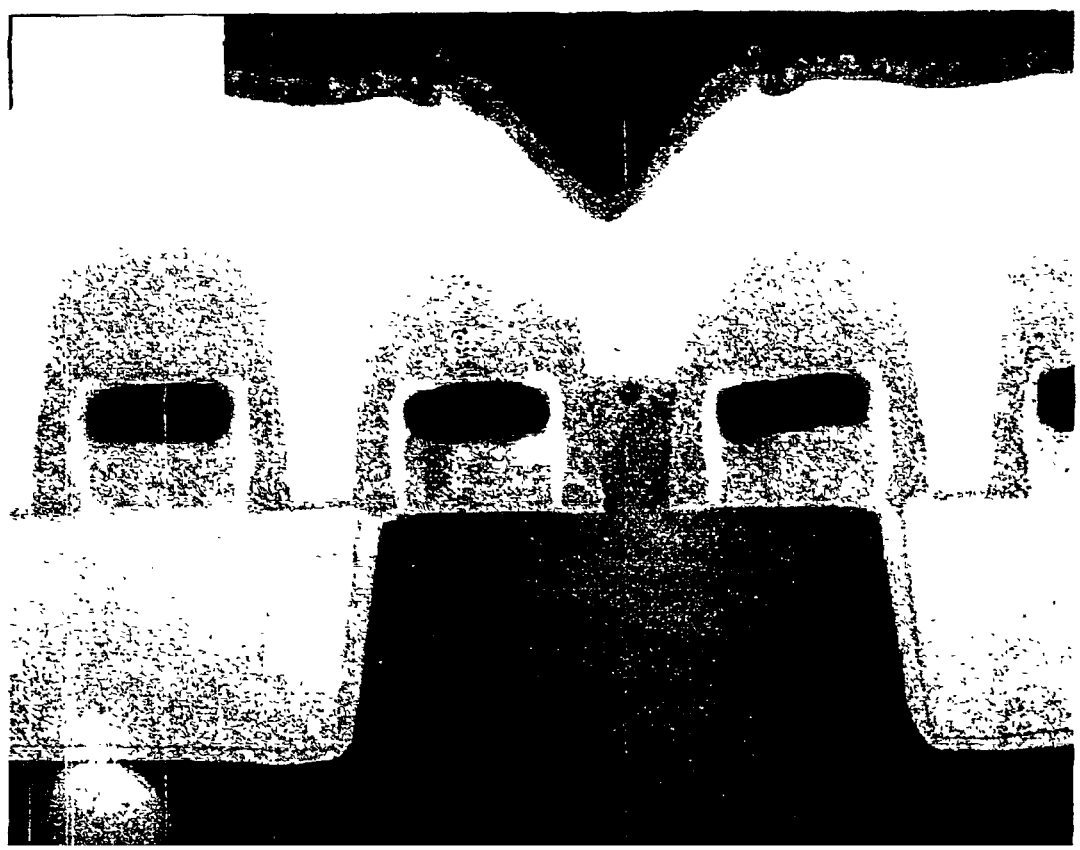
FIG. 1 is a transmission electron microscopic (TEM) picture showing a reduced CB contact resistant chip structure of the invention showing the epi-regrowth CB contact.

On the other hand, FIG. 1 shows that the RIE process did not etch into Si, where the Si base is flat. In that figure, we clearly observed epitaxial growth in the amorphous-Si in the poly contact stud.

Figure 3:
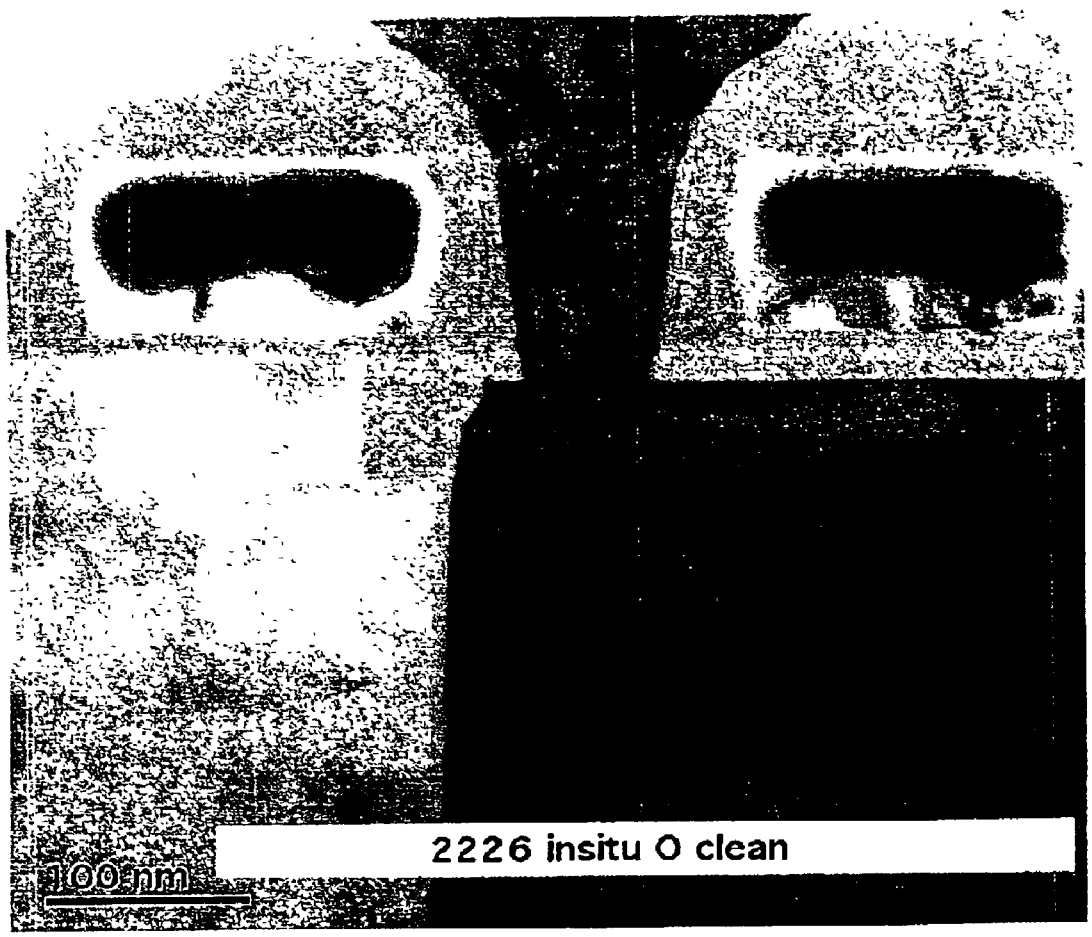
FIG. 3 is a transmission electron microscopic (TEM) picture showing RIE into Si, followed by O plasma treatment to break the C—Si bonding and replace C with O for the terminated Si surface, wherein the amorphous Si in the poly contact stud is epitaxial growm poly Si.

FIG. 3 shows the RIE process etched into Si. With O plasma treatment, which breaks Si—C bonding and replaces C with O for the O terminated Si surface, the amorphous Si in the poly contact stud becomes an epitaxial grown poly Si. The epitaxial grown Si goes all the way up to the top of the poly Si stud, which is superior in epitaxial grown poly Si compared with FIG. 1, where the RIE did not go through to the Si substrate.

In the invention process, the epitaxial grown poly-Si contact stud has much better contact resistance than the non-epitaxial grown poly-Si contact stud.

For the same kind of poly-Si stud, an epitaxial grown Si contact stud and a non-epitaxial grown Si stud have 700 ohm and 3000 ohm, respectively; and better contact resistance results in faster DRAM reading and writing, and high retention time for single cell devices.

We claim:

1. A method of forming a contact, the method comprising:
 a) affecting a liner reactive ion etch on a substrate to remove silicon nitride and silicon oxide;
 b) affecting an oxygen plasma ex-situ clean;
 c) affecting a Huang AB clean;

d) affecting a dilute hydrofluoric acid (DHF) clean;

e) depositing amorphous silicon; and f) annealing to regrow and recrystallize amorphous silicon.

2. The method of claim 1 wherein said substrate comprises silicon.

3. The method of claim 2 wherein in step a) said liner reactive ion etch is conducted at plasma powers equal to or greater than 500 W.

4. The method of claim 3 wherein between steps a) and b) an amorphous silicon layer of about 0.8 Å is formed between a crystalline silicon region and an amorphous silicon region.

5. A method of forming a contact, the method comprising:

a) affecting a reactive ion etch on a substrate to remove silicon nitride and silicon oxide followed by introducing an oxygen plasma in-situ clean;

b) affecting a Huang AB clean;

c) affecting a dilute hydrofluoric acid (DHF) clean;

d) depositing amorphous silicon; and e) annealing to regrow and recrystallize amorphous silicon.

6. The method of claim 5 wherein said substrate comprises silicon.

7. The method of claim 6 wherein in step a) said liner reactive ion etch is conducted at plasma powers equal to or greater than 500 W.

8. The method of claim 7 wherein in step a) prior to said oxygen plasma clean, an amorphous silicon layer of about 0.8 Å is formed between a crystalline silicon region and an amorphous silicon region.

* * * * *